(12) United States Patent
Singhal et al.

(10) Patent No.: US 8,750,805 B2
(45) Date of Patent: Jun. 10, 2014

(54) SYSTEMS AND METHOD FOR SPUR SUPRESSION IN A MULTIPLE RADIO SOC

(75) Inventors: Vivek Singhal, Bangalore (IN); Senthilkannan Chandrasekaran, Bangalore (IN); Sumanth Poddutur, Bangalore (IN); Jasbir Singh, Khanna (IN)

(73) Assignee: Texas Instruments Incorporated, Dallas, TX (US)

( * ) Notice: Subject to any disclaimer, the term of this patent is extended or adjusted under 35 U.S.C. 154(b) by 309 days.

(21) Appl. No.: 12/969,800

(22) Filed: Dec. 16, 2010

(65) Prior Publication Data

US 2012/0154010 A1   Jun. 21, 2012

(51) Int. Cl.
*H04B 1/00* (2006.01)

(52) U.S. Cl.
USPC ............ 455/63.1; 455/67.11; 455/67.13

(58) Field of Classification Search
USPC .......................... 455/90.1; 327/175; 375/295; 342/357.29
See application file for complete search history.

(56) References Cited

U.S. PATENT DOCUMENTS

| | | | |
|---|---|---|---|
| 6,608,589 B1 * | 8/2003 | Devereux et al. | 342/357.29 |
| 6,859,170 B2 * | 2/2005 | Devereux et al. | 342/357.29 |
| 2003/0080792 A1 * | 5/2003 | Azmoodeh | 327/175 |
| 2006/0181321 A1 * | 8/2006 | Azmoodeh | 327/175 |
| 2011/0096864 A1 * | 4/2011 | Yu | 375/295 |

* cited by examiner

*Primary Examiner* — April G Gonzales
(74) *Attorney, Agent, or Firm* — Ronald O. Neerings; Wade James Brady; Frederick J. Telecky, Jr.

(57) ABSTRACT

A digital system includes a spur calculator that computes harmonics of a frequency of a digital clock signal and that identifies a harmonic that lies in a frequency band of operation of a radio frequency circuit. A duty cycle computation module receives the harmonic and computes a duty cycle for the harmonic. Further, a clock generator that is coupled to the duty cycle computation block generates a digital clock signal of the frequency and with the duty cycle such that amplitude of spur caused due to the harmonic is suppressed.

14 Claims, 8 Drawing Sheets

SYSTEMS AND METHOD FOR SPUR SUPRESSION IN A MULTIPLE RADIO SOC

TECHNICAL FIELD

Embodiments of the disclosure relate to spur suppression caused by digital circuit in a multiple radio system on chip (SoC).

BACKGROUND

Solutions providers face many challenges in creating devices that allow radio frequency (RF) connectivity for multiple communication schemes to operate successfully on a single silicon die. Transmission and reception schemes can conflict, forcing innovations in order for on-chip RF functions to coexist or be multiplexed. Sharing the same antenna among different technologies compounds these conflicts and increases the need for enhanced design. Signal interference between different RF technologies can cause difficulties for handset users, including reduced call reliability and even dropped connections.

RF circuit in a multiple radio SoC is prone to interference. It is found that a digital circuit in the SoC significantly contributes to the interference. If any of the harmonics of the frequencies of a digital clock signal (of the digital circuit) lie in any of the RF frequency band of interest, it will interfere with the RF signal and the circuit may not function as expected.

Several existing techniques, for example, frequency planning approach and clock dither technique try to solve this problem of interference. In frequency planning approach a high frequency of operation is selected which does not fall into the frequency band of operation. However, in this approach, effective throughput of the system is affected. Therefore to achieve the same throughput, there would be a need to use random clock swallowing. Timing and area are also impacted due to the increase in clock frequency. In clock dither technique, a jitter in the clock is introduced in order to spread the spectrum of the power profile. However, in clock dither technique, extra complexity is added to the circuit. Also this technique cannot be directly used for clocking the external interfaces, which would otherwise lead to additional complexity in timing.

SUMMARY

An example embodiment provides a digital system. The digital system includes a spur calculator that computes harmonics of a frequency of a digital clock signal and that identifies a harmonic that lies in a frequency band of operation of a radio frequency circuit. A duty cycle computation module receives the harmonic and computes a duty cycle for the harmonic. Further, a clock generator that is coupled to the duty cycle computation block generates the digital clock signal of the frequency and with the duty cycle such that amplitude of spur caused due to the harmonic is suppressed using the digital clock signal.

An example embodiment provides a transceiver. The transceiver includes a victim circuit that operates in a frequency band and a digital aggressor circuit. The digital aggressor circuit includes a spur calculator that computes harmonics of a frequency of a digital clock signal and locates a harmonic that lies in a frequency band; a duty cycle computation module that receives the harmonic and that computes a duty cycle for the harmonic; and a clock generator that is coupled to the duty cycle computation block that generates a digital clock signal with the frequency and with the duty cycle such that amplitude of spur caused due to the harmonic is suppressed using the digital clock signal.

An example embodiment provides a method for use in a multiple radio system on chip (SoC). A plurality of harmonics of each frequency of a plurality of digital clock signals is computed. Further, a harmonic of the plurality of harmonics lies in a frequency band of operation of a radio frequency circuit is identified. A duty cycle for the harmonic is computed such that the amplitude of spur in the RF frequency band of operation caused due to the harmonic is suppressed. A digital clock signal with the frequency and with the duty cycle is then generated.

Other aspects and example embodiments are provided in the Drawings and the Detailed Description that follows.

BRIEF DESCRIPTION OF THE VIEWS OF DRAWINGS

Figure 5:
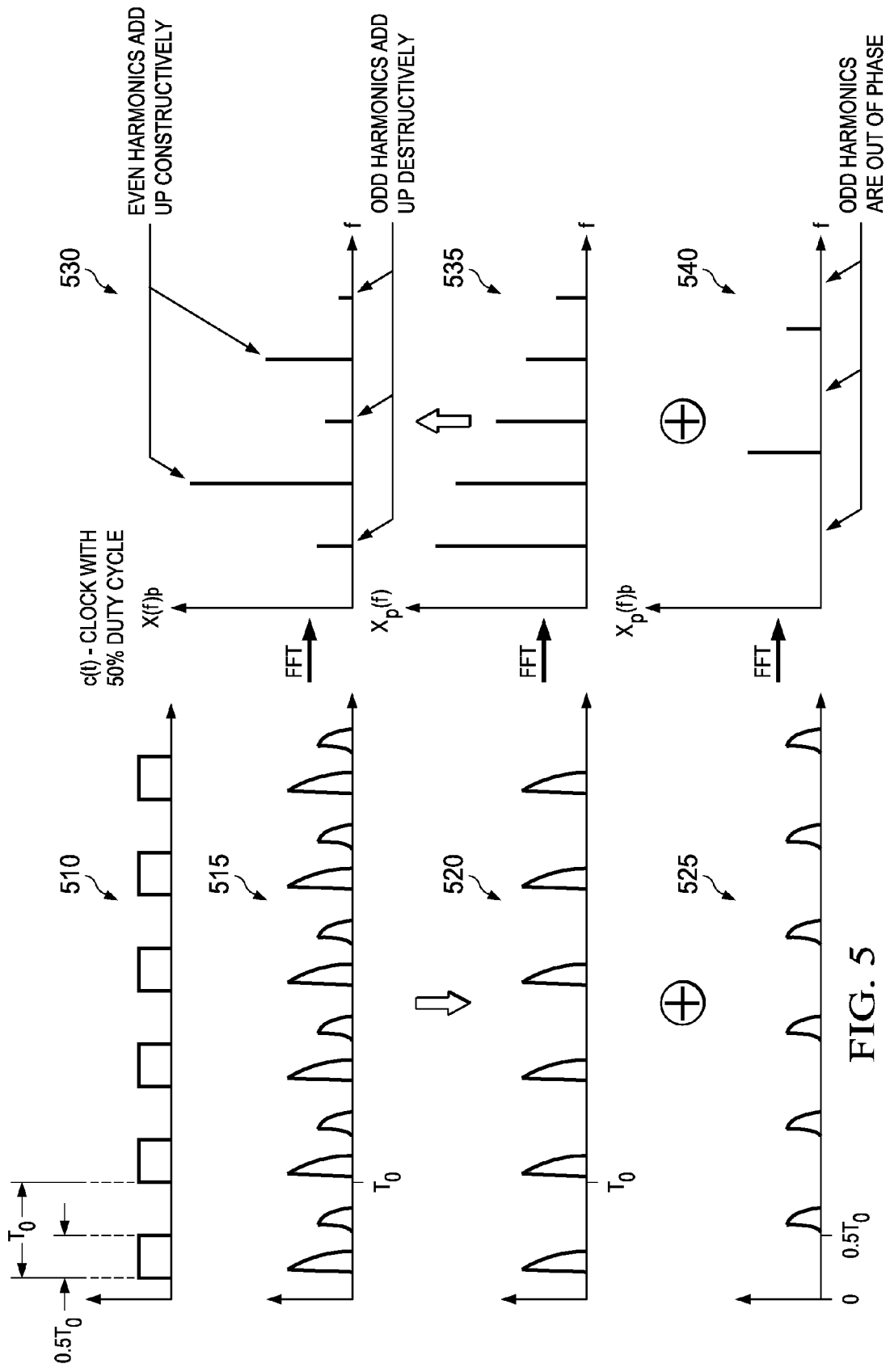
Figure 6A:
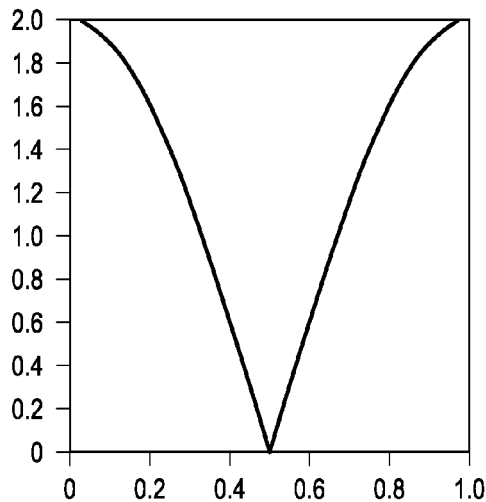
Figure 6B:
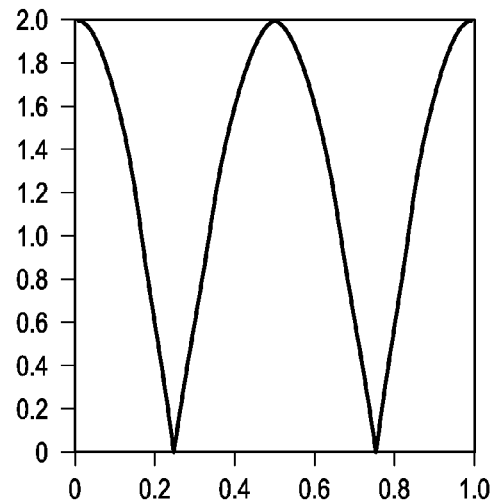
Figure 6C:
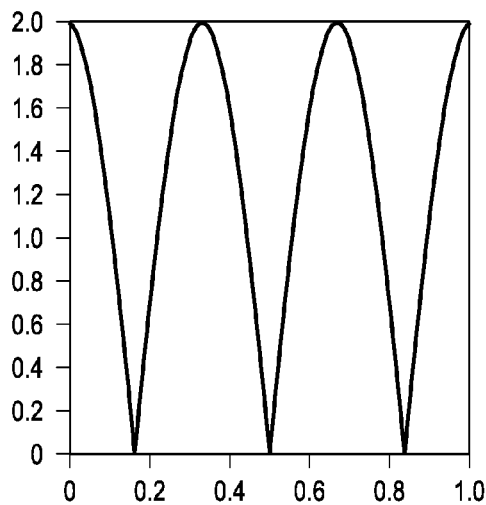
Figure 6D:
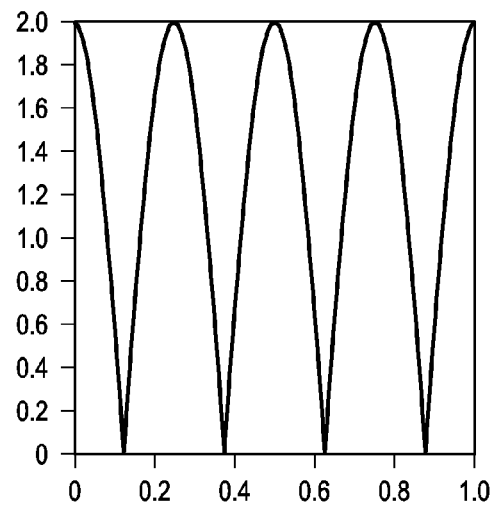
Figure 6E:
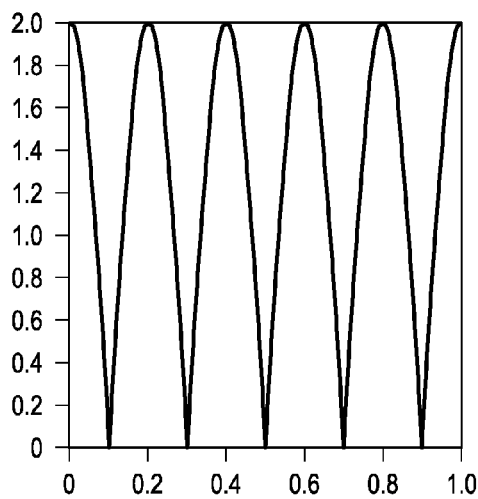
Figure 6F:
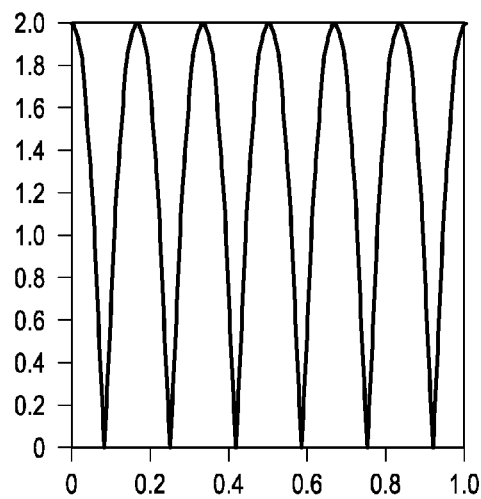
Figure 6G:
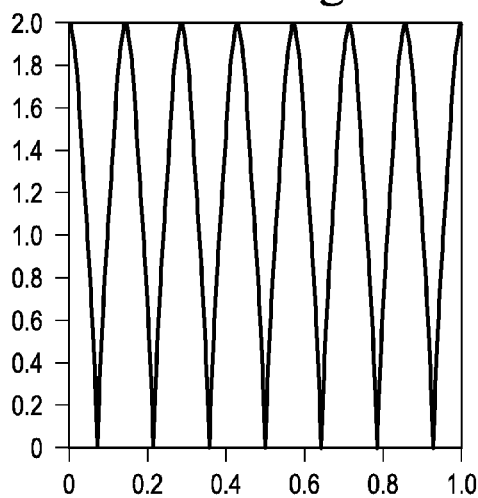
Figure 6H:
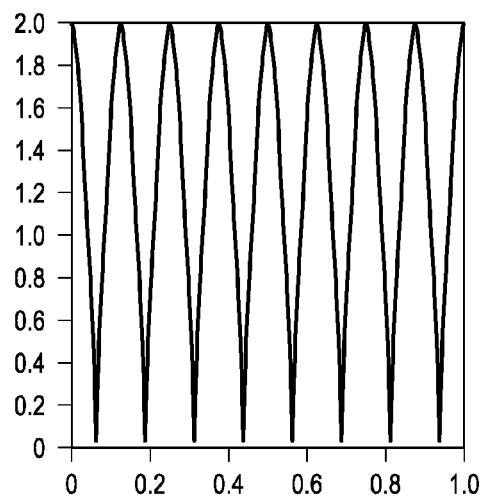
Figure 7:
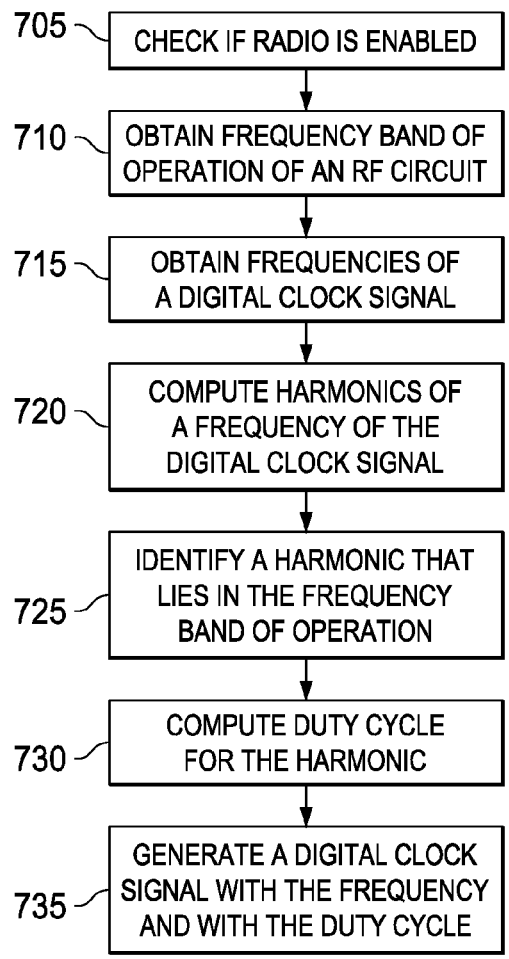
Figure 8:
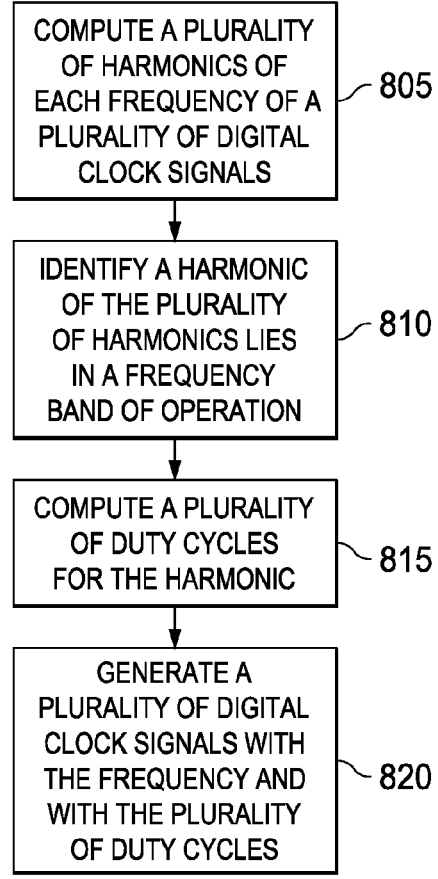

FIG. 5 graphically illustrates the principle used in various embodiments;

FIG. 6a to FIG. 6h illustrate plots for the expression $f(k)=1+\exp(-j*2pi*k*t_0/T_0)$ for varying values of k according to an embodiment;

FIG. 7 is a flow diagram according to an embodiment;

FIG. 8 is a flow diagram according to an embodiment; and

FIGS. 9a to 9f illustrate experimental observations seen by varying duty cycle of the digital clock signal according to an embodiment.

DETAILED DESCRIPTION OF THE EMBODIMENTS

Figure 1:
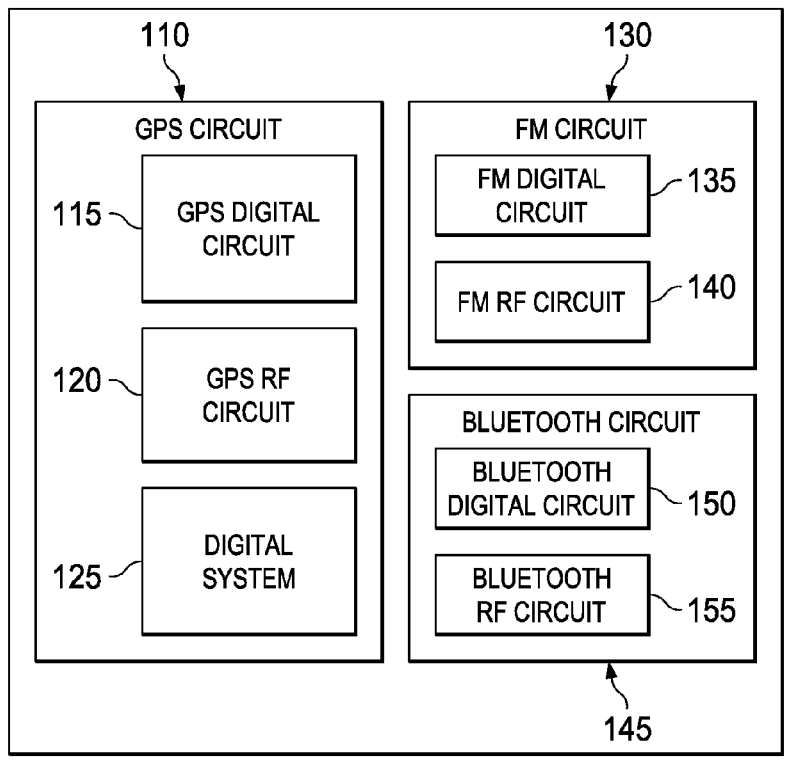
FIG. 1 illustrates a block diagram of an environment where several embodiments may be implemented.

FIG. 1 illustrates a block diagram of an environment, for example a multiple radio system on chip (SoC), where several embodiments may be implemented. The multiple radio SoC, hereinafter referred to as SoC, includes a single chip device that combines functionalities of various communication protocols together with their corresponding radio frequency (RF) circuits such as GPS, BT and FM receiver or transmitter. The SoC includes an aggressor circuit and a victim circuit that interferes with each other in the context of discussion. In several embodiments, the aggressor circuit is a circuit that generates spur which appears as a harmonic of the digital current profile of its own. Similarly, the victim circuit contains an RF circuit such that the spur caused due to the aggressor circuit lies in the frequency band of operation of the RF circuit.

In an embodiment, the victim circuit is, for example, a Frequency Modulation (FM) circuit 130 and the aggressor circuit is, for example, a global positioning system (GPS) circuit 110. The Bluetooth circuit 145 includes a Bluetooth digital circuit 150 and a Bluetooth radio frequency (RF) circuit 155. Similarly, the FM circuit 130 includes an FM digital circuit 135 (victim digital circuit) and an FM RF circuit 140 (victim RF circuit). The FM circuit 130 is capable of transmitting a frequency modulated signal in the transmission mode or demodulating a frequency modulated signal in the reception mode. The FM RF band of operation is 76-108 MHz.

The GPS circuit 110 includes a GPS digital circuit 115 (aggressor digital circuit) and a GPS RF circuit 120 (aggressor digital circuit). The GPS signal spectrum has a center frequency of 1575.42 MHz. The GPS digital circuit 115 acquires and continuously tracks a satellite signal. The GPS RF circuit 120 down-converts a received GPS signal (at 1575.42 MHz) to an intermediate frequency of 4.092 MHz by using a LO (local oscillator) clock of frequency 1571.328 MHz. Further, the intermediate frequency is sent to the GPS digital circuit 115 after sampling using an analog to digital converter (ADC) at a rate of 261 MHz. The digital clock frequency is 32.736 MHz which is obtained by dividing the LO (local oscillator) clock frequency by 48.

As noted above, the GPS digital circuit 115 can be operational at a frequency of approximately 32.736 MHz. A third harmonic of 32.736 MHz, namely 98.208 MHz can act as an aggressor to the FM RF circuit 140 as the frequency band of operation of FM circuit is 96-108 MHz. This leads to coexistence problems between the GPS digital circuit and the FM RF circuit. In an embodiment, coexistence problem is solved by a digital system 125 in the GPS circuit which is illustrated in FIG. 2.

It is noted that the present disclosure is explained using the FM circuit 130 and GPS circuit 110 as an example of victim and aggressor circuits respectively. However, similar structure and functioning is applicable to any two circuits that interfere with each other in the frequency band of operation in an SoC. Examples of victim or aggressor circuits include, but not limited to, Bluetooth circuit, wireless local area network (WLAN) circuit and wireless personal area network (WPAN) circuit, GPS circuit, and near field communication (NFC) circuit.

Figure 2:
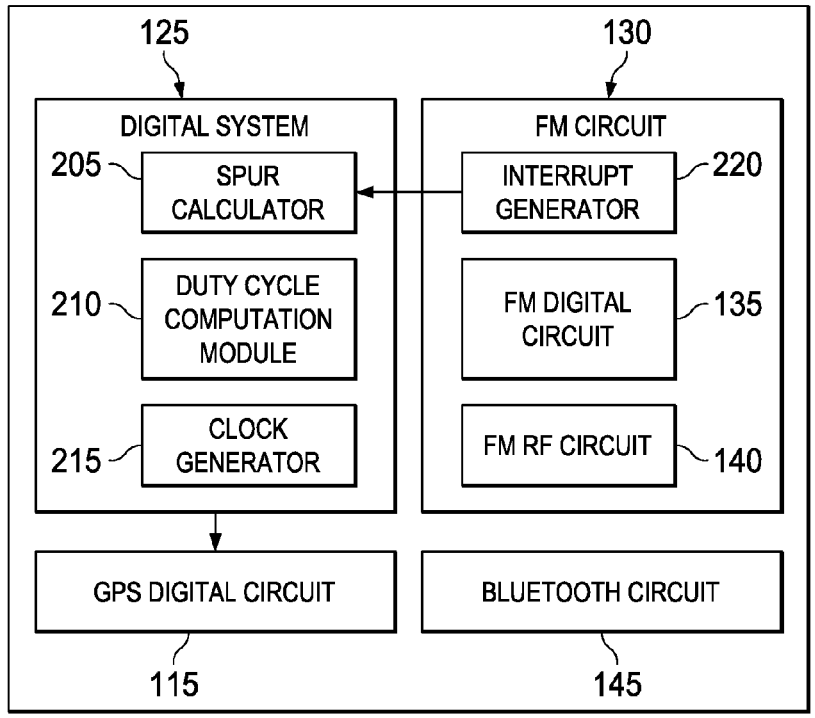
FIG. 2 illustrates an SoC with a digital system according to an embodiment.

Referring now to FIG. 2, the SoC having the digital system 125 according to an embodiment is illustrated that overcomes interference problem between the aggressor and victim circuits in the SoC. The digital system 125 includes a spur calculator 205, a duty cycle computation module 210 and a clock generator 215. An output of the clock generator 215 is connected to the GPS digital circuit 115. FIG. 2 also illustrates the Bluetooth circuit 145 and the FM circuit 130 having the FM digital circuit 135 and the FM RF circuit 140. The FM circuit 130 includes an interrupt generator 220 having an output that is connected to the spur calculator 205.

In operation, the FM circuit 130 communicates the change in the frequency band of operation through the interrupt generator 220, which functions as the communication interface between FM circuit 130. Bluetooth circuit 145 and GPS circuit 110. The interrupt generator 220 generates an interrupt when there is any change in the RF band of operation that is provided to the spur calculator 205. The change in the RF band of operation is generally initiated by the firmware of the victim circuit and is communicated to the firmware of the aggressor circuit. The interrupt includes information about present band of operation of the RF in FM circuit 130 and clock frequencies of GPS digital circuit 115. The interrupt generator includes dedicated registers, which can be programmed for generating interrupt among the communication modules (for example, the GPS circuit 110 can program the registers to communicate with the FM circuit 130 and the Bluetooth circuit 145) for communicating a message. In this embodiment, FM circuit 130 initially programs the frequency band of operation in a shared register and then programs a coexistence interrupt register (not shown in FIG. 2) which is part of the interrupt generator 220 that automatically triggers the interrupt to the firmware inside GPS circuit 110. On receiving this interrupt, the GPS circuit firmware can read the shared register to detect the current FM band of operation.

Based on the interrupt from the interrupt generator 220, the spur calculator 205 computes harmonics of each of clock frequencies of the digital circuit which are falling in the FM RF frequency band and provides the information to duty cycle computation module 210. The duty cycle computation module 210 computes duty cycle for each of the harmonics. The duty cycle computation module 210 selects duty cycle that introduces destructive interference between the positive and negative edges of the current profile of the digital clock for the harmonic. The clock generator 215 receives the duty cycle information for each of the clock frequencies of the digital circuit and generates each clock with the modified duty cycle such that the amplitude of spur caused due to the harmonic is suppressed. The clock generator 215 generates each clock with the modified duty cycle by varying an ON time and an OFF time of the digital clock signal according to the duty cycle using a counter. The counter counts the ON time and OFF time to vary the duty cycle of the digital clock signal.

Duty cycle variation of a digital clock signal for selectively suppressing the spur (harmonics due to the digital power profile) requires that the current profile of the digital circuit should be comparable in the positive and the negative edges of the clock. Theoretical analysis of this embodiment using Fourier series expansion technique is explained below. Two sets of analysis are explained. Firstly, assuming that the power is equal at the positive and negative edges of the digital clock signal which is illustrated in FIG. 3, and then subsequently assuming that the negative clock edge power profile is scaled by a factor from that of the positive clock edge which is illustrated in FIG. 4.

Figure 3:
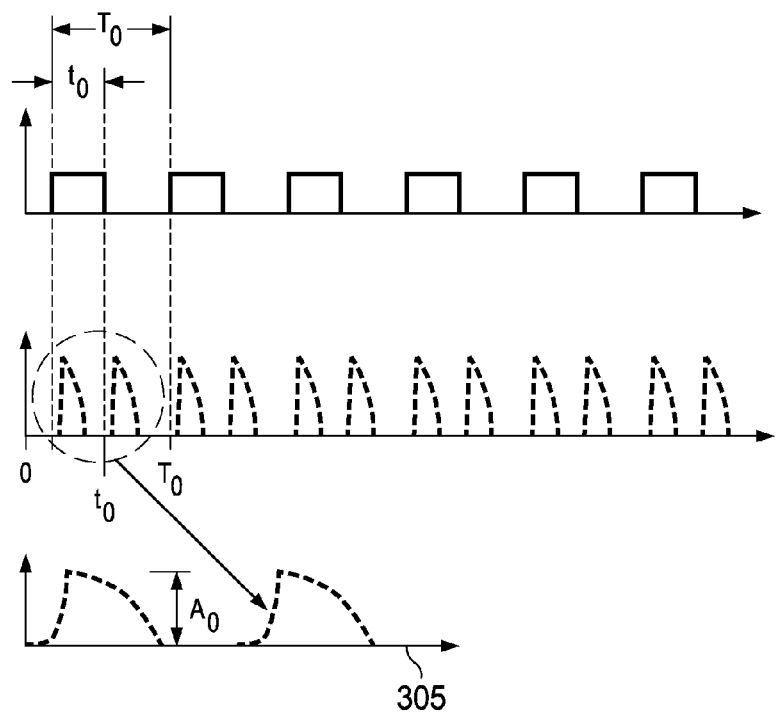
FIG. 3 illustrates a current profile of a digital circuit having equal current profile in the positive and negative clock edges.
Figure 4:
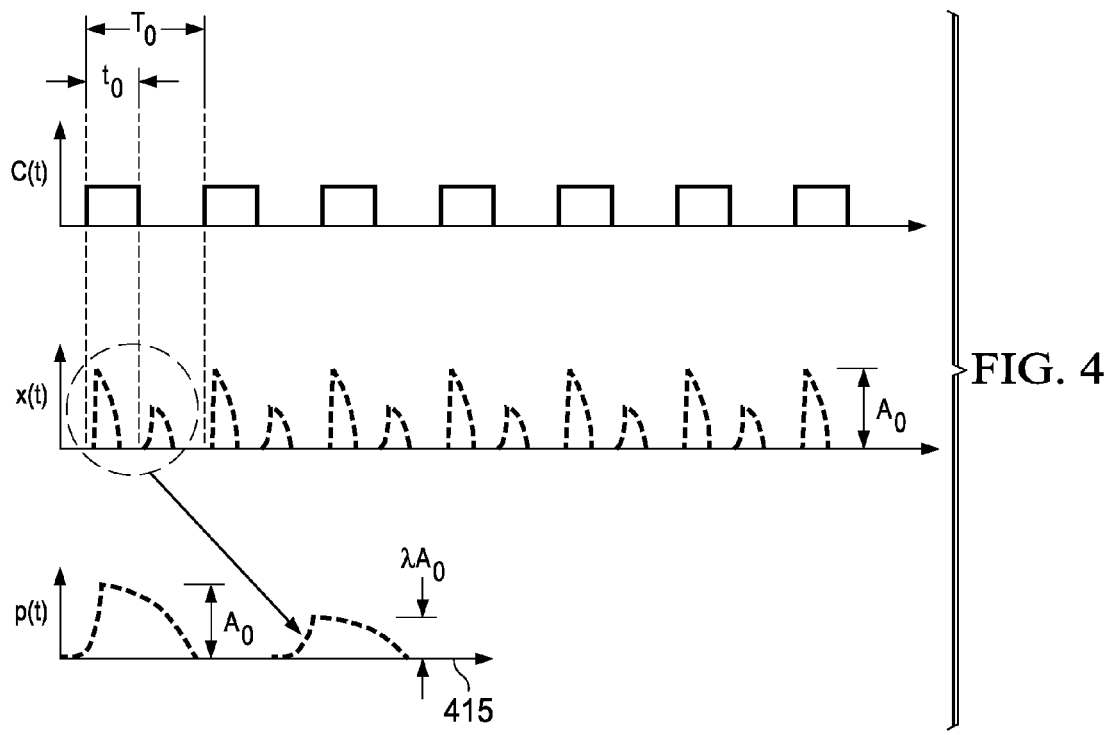
FIG. 4 illustrates a current profile of a digital circuit where current in the negative clock edges is reduced by a factor of $\lambda$ when compared to that of the positive edges.

Referring now to FIG. 3, current profile 305 of a digital circuit whose clock period is $T_0$ which has equal current profile in the positive and negative clock edges is illustrated. If a particular harmonic, hereinafter referred to as the $k^{th}$ harmonic, of the digital clock is found to interfere with a particular RF band, that particular harmonic is suppressed according to an embodiment. Assume that the power is equally distributed in both the positive and negative clock edges of the digital clock.

Let x(t) denote the current profile of the digital domain due to a clock having frequency $T_0$ and ON time of the clock $t_0$.

Then, x(t) can be split into:

$$x(t) = x_p(t) + x_n(t) \quad \text{Equation (1)}$$

Wherein x(t) is total current profile of the digital clock;

Wherein $x_p(t)$ is the current profile (power consumption) due to positive clock edges; and Wherein $x_n(t)$ is the current profile (power consumption) due to negative clock edges.

Assuming uniform power profile, the power profile is periodic and hence using Fourier series x(t), $x_p(t)$ and $x_n(t)$ can be expressed as:

$$x_p(t) = \sum_{k=-\infty}^{k=+\infty} a_k \exp(jkw_0 t) \quad \text{Equation (2)}$$

$$x_n(t) = \sum_{k=-\infty}^{k=+\infty} a_k * \exp(-jkw_0 t_0) * \exp(jkw_0 t)$$

$$x(t) = x_p(t) + x_n(t) = \sum_{k=-\infty}^{k=+\infty} (a_i(1 + \exp(-jkw_0 t_0))) \exp(jkw_0 t))$$

wherein x(t) is the total current profile;

$x_p(t)$ is the current profile due to positive clock edges of the digital clock signal;

$x_n(t)$ is the current profile due to negative clock edges the digital clock signal;

k is the harmonic of the clock frequency;
$a_k$ is the magnitude of the $k^{th}$ harmonic;
$w_0$ is the angular frequency of the clock (w0=2*pi*$f_0$); and
$t_0$ is the ON time of the clock signal.

From equation 2, it can be inferred that the $k^{th}$ harmonic of the current profile is scaled by a factor (1+exp(–jk$w_0 t_0$)). An embodiment minimizes this factor such that amplitude of the $K^{th}$ harmonic is suppressed in the frequency band of operation.

Consider the expression $$f(k)=1+\exp(-jkw_0 t_0) \quad \text{Equation (3)}$$

The minimum value for equation (3) is 0. It is achieved when $$\exp(-jkw_0 t_0)=-1$$

$$\cos(kw_0 t_0)+j\sin(kw_0 t_0)=-1$$

$$\sin(kw_0 t_0)=0;\ \cos(kw_0 t_0)=-1$$

$$=>kw_0 t_0=(2n+1)*\text{pi}$$

$$=>t_0=(2n+1)*T_0/(2k)$$

$$(\text{or})\ d=(2n+1)/(2k)$$

Wherein d is the duty cycle of the digital clock signal; and
Wherein 'n'=0, 1, 2 etc. Is it noted that the value of 'n' must be chosen such that ($t_0/T_0$)<1 since the duty cycle should be anywhere between the values 0 and 1.

Referring now to FIG. 4 a current profile of a digital circuit whose clock period is $T_0$ where the current in the negative clock edges is reduced by a factor λ, when compared to that of the positive edge is shown.

Now the expressions become:

$$x_p(t) = \sum_{k=-\infty}^{k=+\infty} a_k \exp(jkw_0 t) \quad \text{Equation (4)}$$

$$x_n(t) = \sum_{k=-\infty}^{k=+\infty} a_k * \lambda \exp(-jkw_0 t_0) * \exp(jkw_0 t)$$

$$x(t) = x_p(t) + x_n(t) = \sum_{k=-\infty}^{k=+\infty} (a_i(1+\lambda\exp(-jkw_0 t_0)))\exp(jkw_0 t))$$

From equation (4) it can be inferred that the $k^{th}$ harmonic in this case will be scaled by a factor '(1+λexp(–jk$w_0 t_0$))'.

$$f(k)=1+\lambda\exp(-jkw_0 t_0)$$

$$|f(k)|^2=(1+\lambda\cos(kw_0 t_0))^2+(\lambda\sin(kw_0 t_0))^2$$

$$|f(k)|^2=1+2\lambda\cos(kw_0 t_0)+\lambda^2 \quad \text{Equation (5)}$$

Equation (5) reveals that for a given λ, it gets minimized only under the condition, $$\cos(kw_0 t_0)=-1$$

$$=>kw_0 t_0=(2n+1)*\text{pi}$$

$$=>t_0=(2n+1)*T_0/(2k)$$

$$(\text{or})\ d=(2n+1)/(2k)$$

Thus the final condition reduces to the same expression that we had assumed when the power in positive and negative edges are equalized. Under this condition, the minimum value for the expression is given by, $$|f(k)|^2_{min}=(1-\lambda)^2$$

Specifically it is noted using the above expression that, the minimum value reduces to 0, only when (λ=1), meaning that the power is equal in positive and negative clock edges.

To explain various embodiments more in detail, the principle used is described now. Referring to FIG. 5, the period of the digital clock signal is $T_0$ (510) and the duty cycle is 50%. The current profile of the digital clock signal (515) can be decomposed into current profile due to positive clock edges (520) and that due to negative clock edges (525). The fast Fourier transform (FFT) plot of the current profiles of digital clock signal (515) is shown in 530. FFT profile of current profile due to positive clock edges (520) is labeled as 535. FFT profile of current profile due to negative clock edges (525) is labeled as 540. It is noted that for this particular duty cycle (50%), the even harmonics add up constructively and the odd harmonics add up destructively. Hence the odd harmonics are suppressed considerably (can be seen from 530).

FIG. 6a to FIG. 6h illustrate plots for the expression f(k)=I+exp(–j*2pi*k*t0/T0) for varying values of k (harmonic) ranging from 1 to 8.

$$f(k)=1+\exp(-j*2\text{pi}*k*t_0/T_0)$$

$$f(k)=1+\exp(-j*2\text{pi}*k*d)$$

Wherein d is the duty cycle, (0<d<1).

It can be noted from these plots that, higher the harmonics, the number of possible selections of d, where |f(d)| is minimized is increasing. But since the distance between minima and maxima is too small, the duty-cycle needs to be controlled with higher precision.

FIG. 7 is a flow diagram according to an embodiment. At step 705, it is checked if the radio is enabled. If the radio is enabled, at step 710, a frequency band of operation of the RF circuit is obtained. It is noted that RF circuit is contained in the victim circuit, As explained earlier, the interrupt generator generates an interrupt if there is a change in the frequency band of operation of the RF circuit and provides this information to the spur calculator. At step 715, the frequencies of the digital clock signals of the aggressor circuit are obtained that is provided to the spur calculator. In short, the spur calculator receives information on the present band of operation of the RF circuit of victim circuit and clock frequencies of digital circuit of the aggressor circuit. Based on these inputs, the spur calculator computes harmonics of each of digital clock frequencies in the aggressor circuit at step 720. At step 725, the harmonics are identified that lie in the RF frequency band of operation of the victim circuit. At step 730, a duty cycle of the harmonic, which is identified in step 725, is computed such that the amplitude of the harmonics is suppressed. Then at step 735, the clock generator receives the duty cycle information for each of the clock frequencies of the digital circuit and generates each clock signal with the modified duty cycle such that the amplitude of spur caused due to the harmonic is suppressed.

The embodiment illustrated in FIG. 7 can be extended for generating different clock signals, each with different duty cycles (selected based on the harmonic of each clock frequency) if there are multiple digital clock domain which is illustrated in FIG. 8. At step 805, a plurality of harmonics of each frequency of a plurality of digital clock signals is computed. At step 810, it is determined if a harmonic of the plurality of harmonics lies in a frequency band of operation. If there is a harmonic that lies in the frequency band of operation, at step 815, duty cycle for the harmonic is computed as explained earlier. Further, at step 820, a plurality of digital clock signals are generated, each being selected based on the harmonic of each clock frequency, with plurality of duty cycles such that amplitude of the spur caused due to the harmonic is suppressed in the frequency band of operation as explained earlier.

It is noted that the flow diagrams illustrated in FIG. 7 and FIG. 8 can be implemented using a dedicated hardware or in the firmware.

Figure 9A:
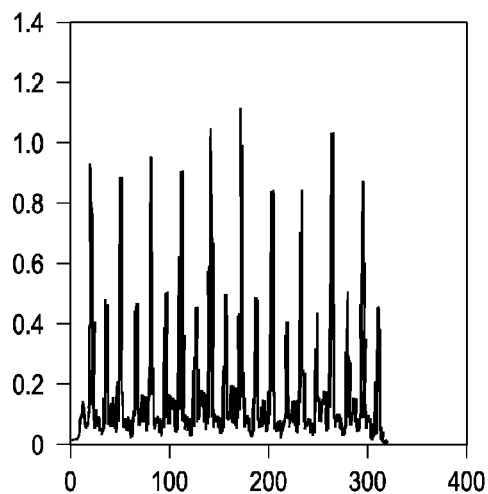
Figure 9B:
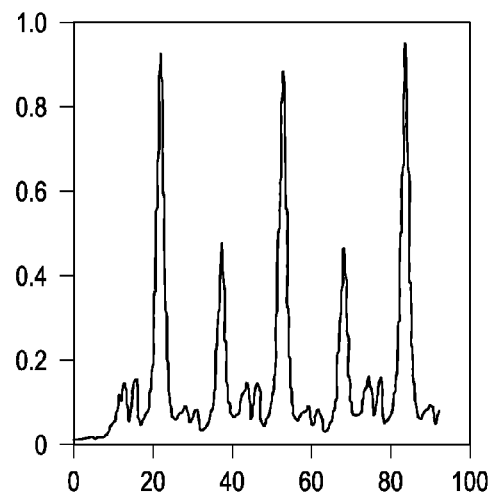
Figure 9C:
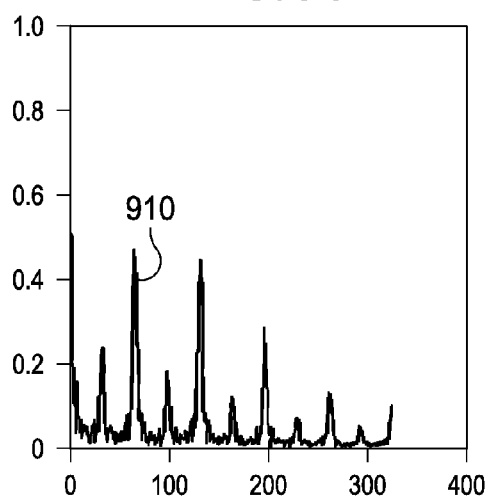
Figure 9D:
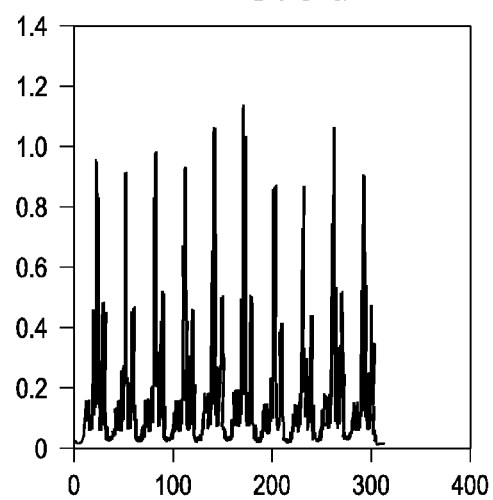
Figure 9E:
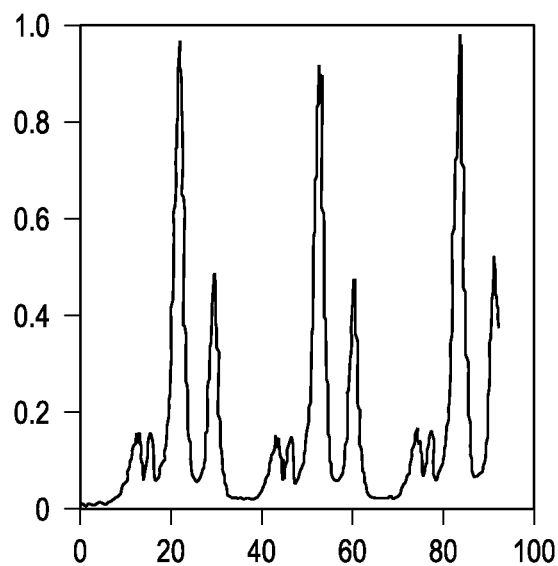
Figure 9F:
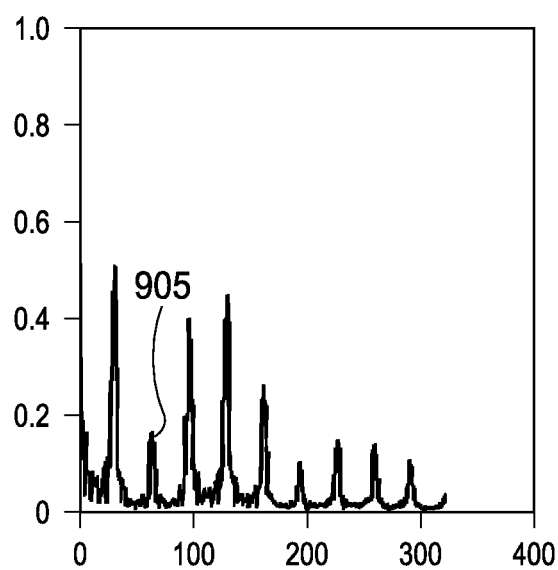

FIGS. 9*a* to 9*f* illustrate experimental observations seen by varying duty cycle of the digital clock signal according to an embodiment. FIG. 9*a* illustrates the current profile of a digital clock signal with 50%-50% duty cycle. FIG. 9*d* illustrates the current profile of a digital clock signal with 25%-75% duty cycle. FIG. 9*b* illustrates the zoomed version of current profile of the digital clock signal with 50%-50% duty cycle. FIG. 9*e* illustrates the zoomed version of current profile of the digital clock signal with 25%-75% duty cycle. FIG. 9*c* illustrates the FFT plot of the current profile of the digital clock signal with 50%-50% duty cycle. FIG. 9*f* illustrates the ITT plot of the current profile of the digital clock signal with 25%-75% duty cycle. It can be noted from 905 that the power in the second harmonic is reduced by 4.8% as compared to the second harmonic (910) of FIG. 9C. It is also noted that further spur suppression can be achieved provided the current profile is equal in both positive and negative clock edges.

Using various embodiments, duty cycle variation of a digital clock signal can be easily implemented in the hardware by using clock division technique from a high frequency clock signal. Also, several embodiments can be used for multiple modes of the victim circuit (which are mutually exclusive with varying RF bands of operation) by varying the duty cycle for each mode based on the band of operation of interest.

In the foregoing discussion, the term "connected" means at least either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following claims.

What is claimed is:

1. A digital system comprising:
    a spur calculator that computes harmonics of a frequency of a digital clock signal and that identifies a harmonic that lies in a frequency band of operation of a radio frequency circuit;
    a duty cycle computation module that receives the harmonic, computes a duty cycle for the harmonic and selects a duty cycle that introduces destructive interference between the positive and negative edges of the current profile of the digital clock for the harmonic; and
    a clock generator, coupled to the duty cycle computation block, that generates the digital clock signal of the frequency and with the duty cycle such that amplitude of spur caused due to the harmonic is suppressed using the digital clock signal.

2. The digital system of claim 1, further comprising an interrupt generator that generates an interrupt signal that includes information about the frequency band of operation.

3. The digital system of claim 1, wherein the clock generator varies an ON time and an OFF time of the digital clock signal according to the duty cycle.

4. The digital system of claim 1, wherein the clock generator comprises a counter that counts the ON time and OFF time to vary the duty cycle of the digital clock signal.

5. The digital system of claim 1 is implemented in a multiple radio system on chip.

6. A digital system comprising:
    a spur calculator that computes harmonics of a frequency of a digital clock signal and that identifies a harmonic that lies in a frequency band of operation of a radio frequency circuit;
    a duty cycle computation module that receives the harmonic and that computes a duty cycle for the harmonic; and
    a clock generator, coupled to the duty cycle computation block, that generates the digital clock signal of the frequency and with the duty cycle such that amplitude of spur caused due to the harmonic is suppressed using the digital clock signal; and
    an interrupt generator that detects a change in the frequency band of operation and generates an interrupt signal that includes information about the frequency band of operation.

7. The digital system of claim 6, further comprising an interrupt generator that generates an interrupt signal that includes information about the frequency band of operation.

8. The digital system of claim 6, wherein the clock generator varies an ON time and an OFF time of the digital clock signal according to the duty cycle.

9. The digital system of claim 6, wherein the clock generator comprises a counter that counts the ON time and OFF time to vary the duty cycle of the digital clock signal.

10. The digital system of claim 6 is implemented in a multiple radio system on chip.

11. A method for use in a multiple radio system on chip (SoC), the method comprising:
    computing a plurality of harmonics of each frequency of a plurality of digital clock signals, comprising receiving frequency information of the plurality of digital clock signals and computing integral multiple of each frequency of the plurality of digital clock signals;
    determining if a harmonic of the plurality of harmonics lies in a frequency band of operation of a radio frequency circuit;
    computing a duty cycle for the harmonic; and
    generating a digital clock signal with the frequency and with the duty cycle such that amplitude of spur caused due to the harmonic is suppressed in the frequency band of operation.

12. The method of claim 11, wherein determining comprises:
    checking if any of the integral multiple lie in the frequency band of operation.

13. The method of claim 11, wherein generating comprises:
    varying the ON time and OFF time of the digital clock signal depending on the duty cycle.

14. A method for use in a multiple radio system on chip (SoC), the method comprising:
- computing a plurality of harmonics of each frequency of a plurality of digital clock signals;
- determining if a harmonic of the plurality of harmonics lies in a frequency band of operation of a radio frequency circuit;
- selecting a duty cycle for the harmonic that introduces destructive interference between the positive and negative edges of the current profile of a digital clock for the harmonic; and
- generating a digital clock signal with the frequency and with the duty cycle such that amplitude of spur caused due to the harmonic is suppressed in the frequency band of operation.

* * * * *